USO11508548B2

(12) United States Patent
Liu et al.

(10) Patent No.: US 11,508,548 B2
(45) Date of Patent: Nov. 22, 2022

(54) SCANNING ELECTRON MICROSCOPE

(71) Applicant: FOCUS-EBEAM TECHNOLOGY (BEIJING) CO., LTD., Beijing (CN)

(72) Inventors: Sha Liu, Beijing (CN); Wei He, Beijing (CN)

(73) Assignee: FOCUS-EBEAM TECHNOLOGY (BEIJING) CO., LTD., Beijing (CN)

( * ) Notice: Subject to any disclaimer, the term of this patent is extended or adjusted under 35 U.S.C. 154(b) by 0 days.

(21) Appl. No.: 17/288,505

(22) PCT Filed: Sep. 21, 2020

(86) PCT No.: PCT/CN2020/116599
§ 371 (c)(1),
(2) Date: Apr. 23, 2021

(87) PCT Pub. No.: WO2021/068736
PCT Pub. Date: Apr. 15, 2021

(65) Prior Publication Data
US 2021/0391142 A1   Dec. 16, 2021

(30) Foreign Application Priority Data

May 13, 2020   (CN) .......................... 202010403981.X

(51) Int. Cl.
*H01J 37/244*   (2006.01)
*H01J 37/22*   (2006.01)
*H01J 37/28*   (2006.01)

(52) U.S. Cl.
CPC ............ *H01J 37/244* (2013.01); *H01J 37/22* (2013.01); *H01J 37/28* (2013.01); *H01J 2237/2445* (2013.01); *H01J 2237/2448* (2013.01)

(58) Field of Classification Search
CPC .. H01J 37/00; H01J 37/02; H01J 37/24; H01J 37/244; H01J 37/22; H01J 37/26;
(Continued)

(56) References Cited

U.S. PATENT DOCUMENTS 3,790,781 A * 2/1974 Horl ...................... H01J 37/228
250/491.1
2017/0345615 A1* 11/2017 Zotta ..................... G06K 9/6215
2019/0287760 A1   9/2019 He et al.

FOREIGN PATENT DOCUMENTS

CN   106525845 A   3/2017
EP       0254128 A2   1/1988
(Continued)

OTHER PUBLICATIONS

International Search Report in the international application No. PCT/CN2020/116599, dated Feb. 7, 2021.

*Primary Examiner* — Jason L McCormack
(74) *Attorney, Agent, or Firm* — Syncoda LLC; Feng Ma

(57) ABSTRACT

A scanning electron microscope includes: an electron optical column, arranged to generate electron beams and focus the electron beams on a specimen; a first detector, arranged to receive electrons generated by the electron beams acting on the specimen; and a second detector, arranged to receive photons generated by the electron beams acting on the specimen. The second detector includes a reflector and a photon detector. The reflector is in a ring shape and is arranged to cover the perimeter of the specimen. The reflector reflects the photons generated on the specimen onto the photon detector. The scanning electron microscope provided by the present disclosure can collect photons in a wide range, and the photon detector has a high reception efficiency.

9 Claims, 9 Drawing Sheets

(58) Field of Classification Search
CPC ........ H01J 37/28; H01J 37/226; H01J 37/228;
H01J 2237/2445; H01J 2237/2448
USPC ................................ 250/306, 307, 310, 311
See application file for complete search history.

(56) References Cited

FOREIGN PATENT DOCUMENTS

| | | |
|---|---|---|
| EP | 2698805 A1 | 2/2014 |
| JP | 2014143348 A | 8/2014 |

* cited by examiner

SCANNING ELECTRON MICROSCOPE

CROSS-REFERENCE TO RELATED APPLICATIONS

The present application is a national stage of International Application No. PCT/CN2020/116599 filed on Sep. 21, 2020, which claims priority to Chinese patent application No. 202010403981.X, filed on May 13, 2020. The disclosures of these applications are hereby incorporated by reference in their entirety.

TECHNICAL FIELD

The present disclosure belongs to the technical field of microscopes, and in particular to a scanning electron microscope.

BACKGROUND

In the related art, a cathode fluorescence signal generated by electron beams acting on a specimen is an electromagnetic wave in ultraviolet, infrared or visible spectra, emitted when the electron beams bombard the surface of the specimen, in addition to secondary electrons, backscattered electrons, Auger electrons and X-ray. The basic principle is that electrons inside the specimen are excited to a high energy state by incident electrons, and then transit back to a low energy state after a certain relaxation time and release energy, and during the energy releasing, part of the energy is emitted in the form of electromagnetic radiation. The physical process in which the specimen generates cathode fluorescence under the excitation of electron beams is determined by the electron structure of the specimen, while the electron structure is related to element composition, lattice structure and defects, as well as mechanical, thermal, electromagnetic environments and other factors. Therefore, an electron beam excited cathode fluorescence spectrum can reflect physical properties of a material through the electron structure of the material.

The detection and processing of an electron beam excited cathode fluorescence signal is usually combined with a scanning electron microscope, which can realize a combined research of morphology observation, structure and composition analysis, and electron beam excited cathode fluorescence spectrum. At present, cathode fluorescence detection is realized by a side-type cathode fluorescence detector, which, however, has a small receiving space angle, and a low collection efficiency. Moreover, the side-type cathode fluorescence detector has a relatively large footprint, and blocks the path of reflection electrons, such as the secondary electrons and the backscattered electrons, which makes it impossible for the scanning electron microscopy to detect the cathode fluorescence and the reflection electrons simultaneously.

In view of this, the present disclosure is proposed.

SUMMARY

The technical problem to be solved by the present disclosure is to overcome the deficiency of the related art by providing a scanning electron microscope. By arranging a ring-shaped reflector above the perimeter of the specimen, the ring-shaped reflector reflects photons above the perimeter of the specimen onto a photon detector, so as to achieve a wide range of photon collection and high reception efficiency of the photon detector.

To solve the technical problem, the present disclosure provides a scanning electron microscope, which includes an electron optical column, a first detector and a second detector.

The electron optical column is arranged to generate electron beams and focus the electron beams on a specimen.

The first detector is arranged to receive electrons generated by the electron beams acting on the specimen.

The second detector is arranged to receive photons generated by the electron beams acting on the specimen.

The second detector includes a reflector and a photon detector. The reflector is in a ring shape and is arranged to cover the perimeter of the specimen. The reflector reflects the photons generated on the specimen onto the photon detector.

In some optional implementations, the reflector is a parabolic reflecting mirror or an ellipsoidal reflecting mirror.

In some optional implementations, the lower surface of the first detector is provided with a reflective film for reflecting the photons incident on the lower surface of the first detector to the second detector.

In some optional implementations, the reflector has a ring shape formed by at least two ellipsoidal reflecting mirrors connected to each other.

In some optional implementations, the first detector is a backscattered electron detector, and the second detector is a cathode fluorescence detector.

In some optional implementations, the photon detector is in a ring shape, the first detector is in a ring shape, the first detector, the reflector and the photon detector are on the same axis, and the axis is the center of a principal optic axis of the electron beams generated by an electron source.

In some optional implementations, the reflector includes a light outlet and a port which are connected, and the light outlet faces towards the specimen.

Further, the diameter of the port is greater than or equal to the peripheral diameter of the first detector.

The diameter of the light outlet is greater than the diameter of the center hole of the photon detector.

In some optional implementations, the reflector includes a light outlet and a port which are connected, and the light outlet faces towards the first detector.

Further, the diameter of the light outlet is greater than the diameter of the center hole of the photon detector.

The diameter of the center hole of the photon detector is greater than or equal to the peripheral diameter of the first detector.

After the above technical solution is adopted, the present disclosure has the following beneficial effects compared with the related art.

In the scanning electron microscope provided by the present disclosure, the second detector includes the reflector and the photon detector. The reflector is arranged to reflect the photons generated on the specimen onto the photon detector. By arranging the ring-shaped reflector above the perimeter of the specimen, the ring-shaped reflector reflects the photons above the perimeter of the specimen onto the photon detector, so as to achieve a wide range of photon collection and high reception efficiency of the photon detector.

The specific implementations of the present disclosure are described in detail below in combination with the accompanying drawings.

BRIEF DESCRIPTION OF THE DRAWINGS

The accompanying drawings as a part of the present disclosure are used for providing further understanding of the present disclosure. Schematic embodiments of the present disclosure and description thereof are used for illustrating the present disclosure and not intended to form an improper limit to the present disclosure. It is apparent that the accompanying drawings in the following description are only some embodiments, for those of ordinary skill in the art, some other accompanying drawings may also be obtained according to these on the premise of not contributing creative effort. In the accompanying drawings.

Figure 1:
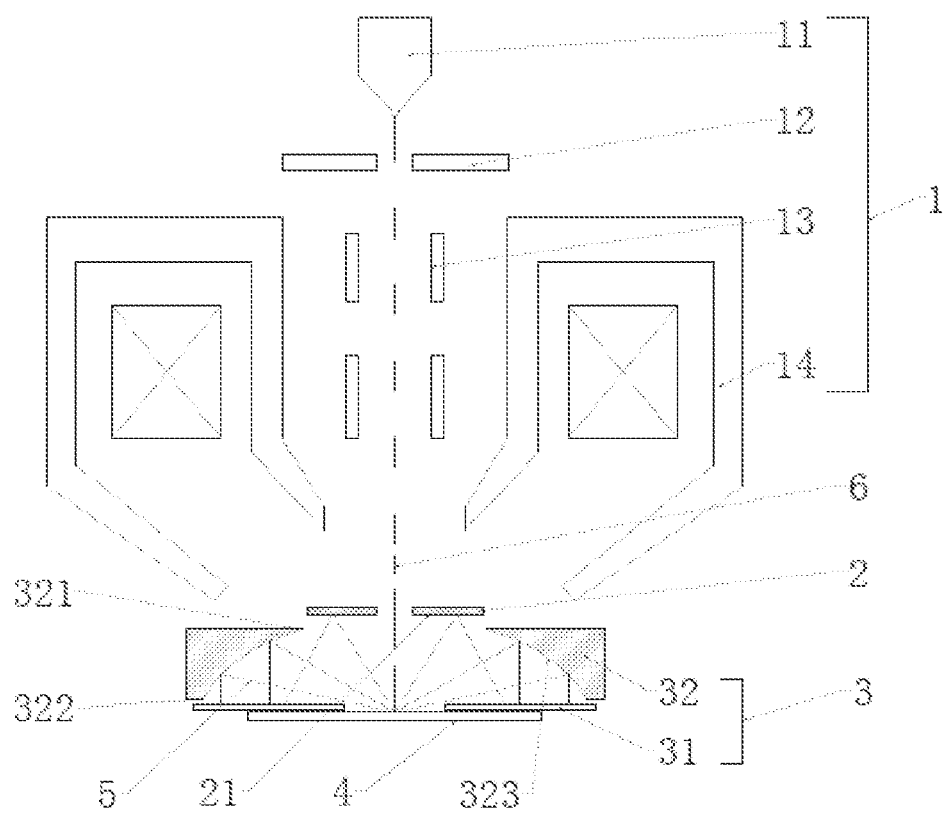
FIG. 1 illustrates an overall structure diagram of a first implementation of a scanning electron microscope provided by the present disclosure.

In the accompanying drawings: 1. Electron optical column; 11. Electron source; 12. Electron accelerating structure; 13. Deflecting device; 14. Object lens system;

2. First detector; 21. Reflective film;

3. Second detector; 31. Photon detector; 32. Reflector; 321. Port; 322. Light outlet; 323. Reflecting surface;

4. Specimen stage; 5. Cathode fluorescence; and 6. Principal optic axis.

It is to be noted that these accompanying drawings and descriptions are not intended to limit the concept scope of the present disclosure in any way, but to illustrate the concept of the present disclosure by referring to specific embodiments for those skilled in the art.

It is to be noted that these accompanying drawings and descriptions are not intended to limit the concept scope of the present disclosure in any way, but to illustrate the concept of the present disclosure by referring to specific embodiments for those skilled in the art.

DETAILED DESCRIPTION

For making the purpose, technical solutions and advantages of the present disclosure clearer, the technical solutions in the embodiments will be clearly and completely described below in combination with the accompanying drawings in the embodiments of the present disclosure. The following embodiments are used for illustrating the present disclosure, but not for limiting the scope of the present disclosure.

In the description of the present disclosure, it is to be noted that orientation or position relationships indicated by terms "upper", "lower", "front', "back", "left", "right", "vertical", "inside", "outside" and the like are orientation or position relationships shown in the drawings, are adopted not to indicate or imply that indicated devices or components must be in specific orientations or structured and operated in specific orientations but only to conveniently describe the application and simplify descriptions.

In the description of the present disclosure, it is to be noted that unless otherwise definitely specified and limited, terms "mount", "connected" and "connect" should be broadly understood. For example, the terms may refer to fixed connection and may also refer to detachable connection or integrated connection. The terms may refer to mechanical connection or electrical connection. The terms may refer to direct mutual connection, may also refer to indirect connection through a medium. For those of ordinary skill in the art, specific meanings of these terms in the application can be understood according to a specific condition.

As shown in FIG. 1 to FIG. 9, the present disclosure provides a scanning electron microscope, which may include: an electron optical column 1, a first detector 2 and a second detector 3. The electron optical column 1 is arranged to generate electron beams and focus the electron beams on a specimen. The first detector 2 is arranged to receive electrons generated by the electron beams acting on the specimen. The second detector 3 is arranged to receive photons generated by the electron beams acting on the specimen. The second detector 3 includes a reflector 32 and a photon detector 31. The reflector 32 is in a ring shape and is arranged to cover the perimeter of the specimen. The reflector 32 reflects the photons generated on the specimen onto the photon detector 31.

In the scanning electron microscope provided by the present disclosure, the second detector 3 includes the reflector 32 and the photon detector 31. The reflector 32 is arranged to reflect the photons generated on the specimen onto the photon detector 31. By arranging the ring-shaped reflector 32 above the perimeter of the specimen, the ring-shaped reflector 32 reflects the photons above the perimeter of the specimen onto the photon detector 31, so as to achieve a wide range of photon collection and high reception efficiency of the photon detector 31.

The electron optical column 1 is arranged to generate the electron beams and focus the electron beams on the specimen. The electron optical column 1 may include an electron source 11, an electron accelerating structure 12 and an object lens system 14.

Specifically, the electron source 11 is arranged to generate the electron beams. The electron source 11 includes a field-induced emission source and a thermal emission source. The field-induced emission source may be of a hot field type or a cold field type. The thermal emission source may use tungsten wire, lanthanum hexaboride, or the like. In the present disclosure, the electron source 11 may be any electron source 11 for generating the electron beams.

The electron accelerating structure 12 is an anode and is arranged to generate an electric field along an emission direction of the electron beams, to increase the velocity of the electron beams.

The object lens system 14 is arranged to control the size and moving direction of the electron beams emitted from the electron source 11. The object lens system 14 focuses the electron beams on the specimen and performs scanning on the specimen.

The object lens system 14 includes an object lens and a deflecting device 13. The object lens may be a magnetic lens, or an electric lens, or an electromagnetic complex lens. The deflecting device 13 may be a magnetic deflecting device or an electric deflecting device.

The deflecting device 13 is arranged to change the direction of motion of the electron beams incident on the specimen and can generate a scanning field with arbitrary deflection directions.

When applied to the specimen, the electron beams may generate secondary electrons, backscattered electrons, Auger electrons, cathode fluorescence 5 and X-ray.

The first detector 2 is arranged to receive electrons generated by the electron beams acting on the specimen.

In some optional implementations, the first detector 2 is arranged between the electron source 11 and the specimen. Specifically, the first detector 2 may be arranged above the object lens system 14, or may be arranged in the object lens system 14, and or may be arranged below the object lens system 14.

The electrons generated by the electron beams acting on the specimen include secondary electrons, backscattered electrons and other electrons.

Taking that the received electrons are the secondary electrons and the backscattered electrons as an example, the first detector 2 may be a secondary electron detector which is dedicated to receiving the secondary electrons, or the first detector 2 may be a backscattered electron detector which is dedicated to receiving the backscattered electrons, or the first detector 2 may be a detector which may receive the secondary electrons and the backscattered electrons simultaneously. In the present disclosure, those skilled in the art may select the type of the first detector 2 for receiving the electrons of the corresponding type according to actual needs.

The second detector 3 is arranged to receive photons generated by the electron beams acting on the specimen.

The photons generated by the electron beams acting on the specimen include cathode fluorescence 5, X-ray and other photons.

Taking that the received photons are the cathode fluorescence 5 and the X-ray as an example, the second detector 3 may be a cathode fluorescence detector dedicated to receiving the cathode fluorescence 5, or the second detector 3 may be a X-ray detector dedicated to receiving the X-ray, or the second detector 3 may be a detector which may receive both the cathode fluorescence 5 and the X-ray simultaneously. In the present disclosure, those skilled in the art may select the type of the second detector 3 for receiving the photons of the corresponding type according to actual needs.

The second detector 3 includes a reflector 32 and a photon detector 31. The reflector 32 is in a ring shape and is arranged to cover the perimeter of the specimen. The reflector 32 reflects the photons generated on the specimen onto the photon detector 31. The ring-shaped reflector 32 is arranged to cover the perimeter of the specimen. By arranging the ring-shaped reflector 32 above the perimeter of the specimen, the ring-shaped reflector 32 reflects photons above the perimeter of the specimen onto the photon detector 31, so as to achieve a wide range of photon collection and high reception efficiency of the photon detector 31.

It is to be noted that ring shape refers to a ring-shaped structure with a through hole in the middle. The through hole and the periphery are not limited to a circle.

Figure 5:
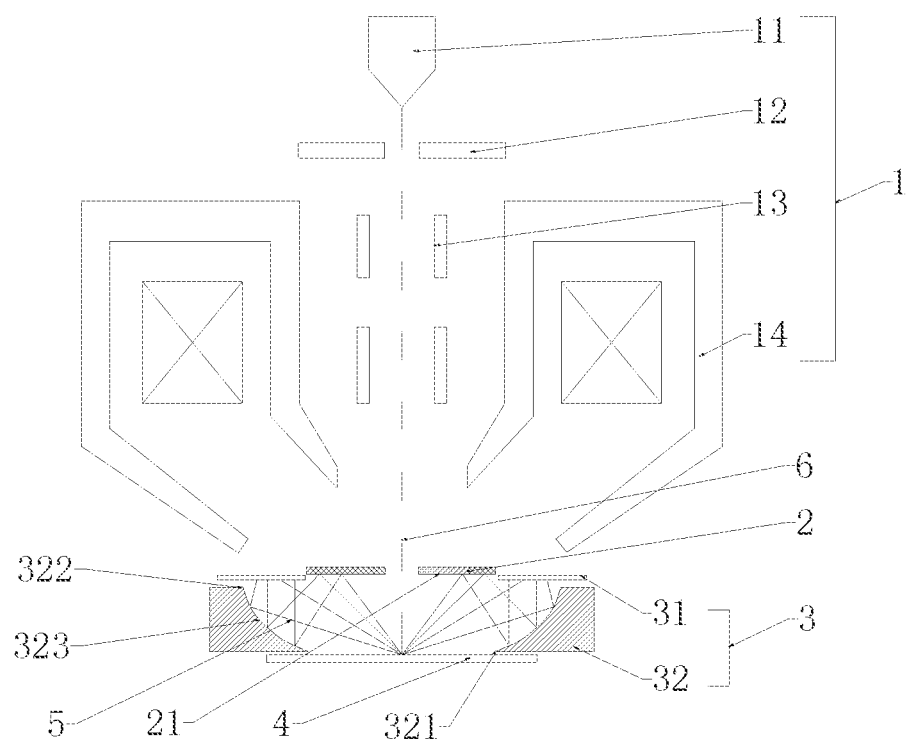
FIG. 5 illustrates an overall structure diagram of a second implementation of a scanning electron microscope provided by the present disclosure.

As shown in FIG. 1 and FIG. 5, taking that the first detector 2 is the backscattered electron detector and the second detector 3 is the cathode fluorescence detector as an example, after passing through the through hole of the cathode fluorescence detector, the backscattered electrons generated by the electron beams acting on the specimen are incident on the backscattered electron detector and are received by the backscattered electron detector.

The cathode fluorescence 5 generated by the electron beams acting on the specimen is incident on the cathode fluorescence detector and is received by the cathode fluorescence detector. The scanning electron microscope provided by the present disclosure realizes the simultaneous large-area collection of the backscattered electron and the cathode fluorescence 5, which are received simultaneously with high reception efficiency.

It is to be noted that those skilled in the art may configure both the first detector 2 and the second detector 3 on the scanning electron microscope, or select any one of them. Those skilled in the art may select and configure according to actual needs.

In some optional implementations, in the scanning electron microscope provided by the present disclosure, the first detector 2, the second detector 3 and the electron optical column 1 are integrated or set independently of each other; or, any two of them are integrated, and the other is set independently.

For example, the first detector 2 and the second detector 3 may be integrated in the electron optical column 1; or the first detector 2, the second detector 3 and the electron optical column 1 are set independently of each other; or the first detector 2 is integrated in the electron optical column 1, and the second detector 3 is set independently.

As shown in FIG. 1 to FIG. 9, in some optional implementations, the reflector 32 is a parabolic reflecting mirror or an ellipsoidal reflecting mirror.

The parabolic reflecting mirror may convert a light source placed at a focal point of the reflecting mirror into a parallel beam. When the reflector 32 is the parabolic reflecting mirror, the parabolic reflecting mirror is arranged to cover the perimeter of the specimen. After the photons generated on the specimen are incident on the parabolic reflecting mirror, the parabolic reflecting mirror converts the photons incident on it into a parallel beams and reflects the beams on the photon detector 31.

The ellipsoidal reflecting mirror enables the light beams to be refocused to a second focal point when the light source is placed at the first focal point. When the reflector 32 is the ellipsoidal reflecting mirror, the ellipsoidal reflecting mirror is arranged to cover the perimeter of the specimen. After the photons generated on the specimen are incident on the ellipsoidal reflecting mirror, the ellipsoidal reflecting mirror focuses the photons incident on it on the photon detector 31.

As shown in FIG. 3, FIG. 4, FIG. 7 and FIG. 8, in some optional implementations, the reflector 32 consists of at least two ellipsoidal reflecting mirrors connected together to form a ring. A plurality of ellipsoidal reflecting mirrors are connected in turn to form the ring-shaped reflector 32 with a through hole in the middle. The ring-shaped reflector 32 is arranged to cover the perimeter of the specimen. After the photons generated on the specimen are incident on each ellipsoidal reflecting mirror, each ellipsoidal reflecting mirror focuses the photons incident on the corresponding ellipsoidal reflecting mirror on the photon detector 31. Preferably, four identical ellipsoidal reflecting mirrors are connected in turn to form the ring-shaped reflector 32 with a through hole in the middle.

As shown in FIG. 1 to FIG. 9, in some optional implementations, the lower surface of the first detector 2 is provided with a reflective film 21 for reflecting the photons incident on the lower surface of the first detector 2 to the second detector 3.

Further, the reflective film 21 is a metal film, such as an aluminum film, or a gold film, or a silver film.

The lower surface of the first detector 2 is provided with the reflective film 21. The photons incident on the lower surface of the first detector 2 are reflected to the second detector 3 by the reflective film 21, which improves the reception efficiency of the second detector 3.

As shown in FIG. 1 to FIG. 9, in some optional implementations, the photon detector 31 is in a ring shape, the first detector 2 is in a ring shape, the first detector 2, the reflector 32 and the photon detector 31 are on the same axis, and the axis is the center of a principal optic axis 6 of the electron beams generated by an electron source 11.

In some optional implementations, the photon detector 31 is in a ring shape. The photon detector 31 may be a ring shape formed by a plurality of photon detectors connected. The plurality of photon detectors are connected in turn to form the ring-shaped photon detector 31 with a through hole in the middle.

As shown in FIG. 1 to FIG. 4 and FIG. 9, in some optional implementations:

the scanning electron microscope provided by the present disclosure may include from top to bottom: the electron optical column 1, the first detector 2, the second detector 3 and a specimen. The specimen is placed on a specimen stage 4. The electron optical column 1 may include: the electron source 11, the electron accelerating structure 12 and the object lens system 14. The object lens system 14 focuses the electron beams on the specimen and scans it.

The first detector 2 is arranged to receive the electrons generated by the electron beams acting on the specimen. The second detector 3 is arranged to receive the photons generated by the electron beams acting on the specimen. The reflector 32 is in a ring shape and is arranged to cover the perimeter of the specimen. The reflector 32 reflects the photons generated on the specimen on the photon detector 31.

In some optional implementations, the first detector 2 is in a ring shape, the photon detector 31 is in a ring shape, and the reflector 32 is in a ring shape. The first detector 2, the reflector 32 and the photon detector 31 are on the same axis, and the axis is the center of the principal optic axis 6 of the electron beams generated by the electron source 11.

The reflector 32 includes a light outlet 322 and a port 321 which are connected, and the light outlet 322 faces towards the specimen. The photon detector 31 may be provided above the specimen stage 4 or below the specimen stage 4, or the specimen stage 4 is at the center hole of the photon detector 31. The specimen stage 4 is in the inner ring, and the photon detector 31 is in the outer ring.

The present embodiment is illustrated taking that the photon detector 31 is provided above the specimen stage 4 as an example.

The photon detector 31 is provided between the reflector 32 and the specimen stage 4. The reflector 32 is provided with a center hole, one end of which is the light outlet 322 and the other end is the port 321. The light outlet 322 is an outlet of the light reflected by the reflector 32, that is, the end of the reflected light outlet of the center hole.

Further, the diameter of the port 321 is greater than or equal to the peripheral diameter of the first detector 2, and the diameter of the light outlet 322 is greater than the diameter of the center hole of the photon detector 31.

An illustration is given taking that the first detector 2 is the backscattered electron detector, the second detector 3 is the cathode fluorescence detector, and the photon detector 31 is the cathode fluorescence detector as an example.

The velocity of the electron beams generated by the electron source 11 is increased after passing through the electron accelerating structure 12. The electron beam, which is accelerated by the electron accelerating structure 12, moves downward after being focused and changed in the direction of motion by the object lens system 14, acts on the specimen after passing through the center hole of the backscattered electron detector, the center hole of the reflector 32 and the center hole of the cathode fluorescence detector successively, and generates the secondary electrons, the backscattered electrons, the Auger electrons, the cathode fluorescence 5 and the X-ray.

The backscattered electrons generated by the electron beams acting on the specimen scatter upwards directly from the specimen. The backscattered electrons are received by the backscattered electron detector above after passing through the center hole of the cathode fluorescence detector and the center hole of the reflector 32.

The cathode fluorescence 5 generated by the electron beams acting on the specimen scatter upwards directly from the specimen. After the cathode fluorescence 5 passes through the center hole of the cathode fluorescence detector and the ring-shaped reflector 32 provided above the perimeter of the specimen, the ring-shaped reflector 32 reflects the cathode fluorescence 5 scattering from the perimeter of the specimen on the cathode fluorescence detector, which realizes the large-area collection of the cathode fluorescence 5 and high reception efficiency of the cathode fluorescence detector.

Moreover, another part of the cathode fluorescence 5 is incident on the lower surface of the backscattered electron detector after passing through the center hole of the cathode fluorescence detector and the center hole of the reflector 32 successively. The lower surface of the backscattered electron detector is provided with the reflective film 21. The cathode fluorescence 5 incident on the lower surface of the backscattered electron detector is reflected on the cathode fluorescence detector by the reflective film 21. The reception efficiency of the cathode fluorescence detector for the cathode fluorescence 5 is improved. The scanning electron microscope provided by the present disclosure realizes the simultaneous large-area collection of the backscattered electron and the cathode fluorescence 5, which are received simultaneously with high reception efficiency.

Figure 9:
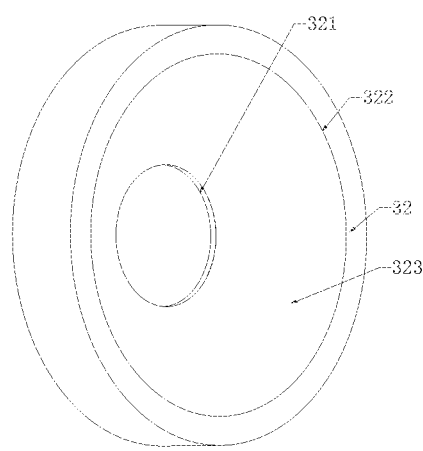
FIG. 9 illustrates a structural schematic diagram of a reflector provided by the present disclosure.

Specifically, as shown in FIG. 9, the surface for reflecting the cathode fluorescence 5 of the reflector 32 is a reflecting surface 323. The reflecting surface 323 may be a paraboloid, an ellipsoid, or any other shape that can reflect the cathode fluorescence 5 incident on the reflecting surface 323 onto the cathode fluorescence detector.

In a specific optional embodiment, as shown in FIG. 1, the reflector 32 is the parabolic reflecting mirror, the point where the electron beams act on the specimen is an action point, which coincides with the focal point of the parabolic reflecting mirror, the parabolic reflecting mirror is arranged to cover the perimeter of the specimen, the cathode fluorescence 5 is generated from the action point where the electron beams act on the specimen and scatters upwards from the specimen, and after the cathode fluorescence 5 is incident on the parabolic reflecting mirror, the parabolic reflecting mirror converts the cathode fluorescence 5 incident on it into a parallel cathode fluorescence beams and reflects the beams on the cathode fluorescence detector.

Figure 2:
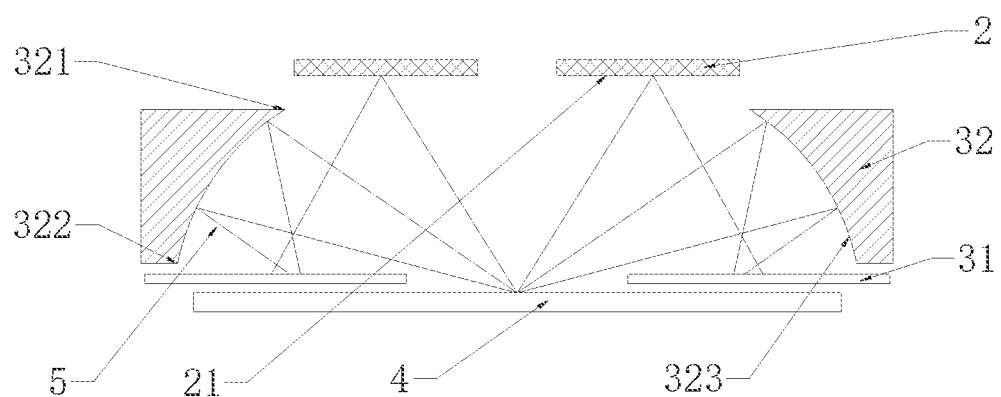
FIG. 2 illustrates a structural schematic diagram of another implementation of a second detector in FIG. 1 of the present disclosure.

In some optional embodiments, as shown in FIG. 2, the reflector 32 is the ellipsoidal reflecting mirror, the point where the electron beams act on the specimen is an action point, which coincides with the focal point of the ellipsoidal reflecting mirror, the ellipsoidal reflecting mirror is arranged to cover the perimeter of the specimen, the cathode fluorescence 5 is generated from the action point where the electron beams act on the specimen and scatters upwards from the specimen, and after the cathode fluorescence 5 is incident on the ellipsoidal reflecting mirror, the ellipsoidal reflecting mirror focuses the cathode fluorescence 5 incident on it on the cathode fluorescence detector.

Figure 3:
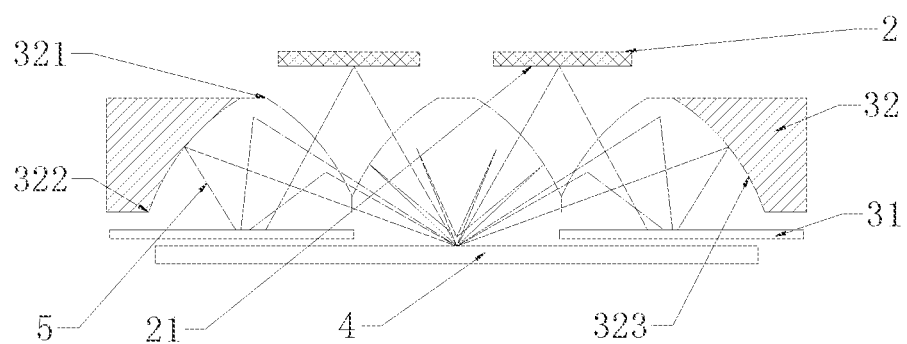
FIG. 3 illustrates a structural schematic diagram of yet another implementation of the second detector in FIG. 1 of the present disclosure.
Figure 4:
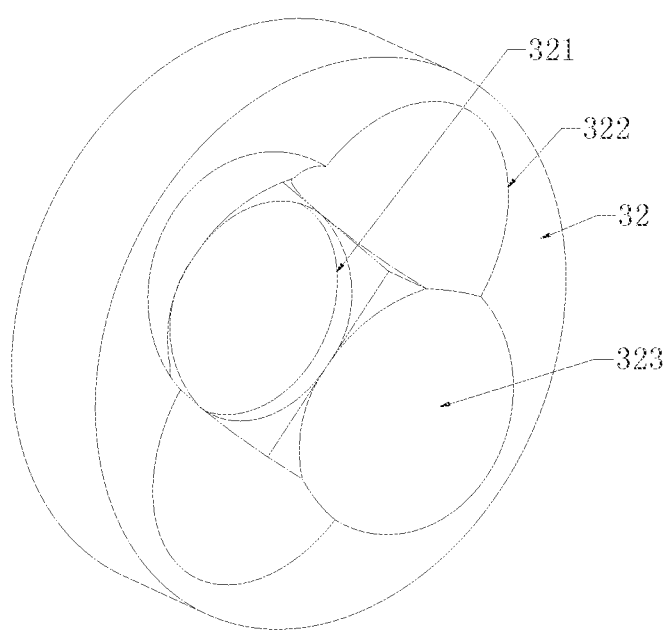
FIG. 4 illustrates a structural schematic diagram of a reflector in FIG. 3 of the present disclosure.

In some optional implementations, as shown in FIG. 3 and FIG. 4, the reflector 32 is in the ring shape formed by at least two ellipsoidal reflecting mirrors connected to each other. A plurality of ellipsoidal reflecting mirrors are connected successively to form the ring-shaped reflector 32 with a through hole in the middle. The ring-shaped reflector 32 is arranged to cover the perimeter of the specimen. After the cathode fluorescence 5 generated by the electron beams acting on the specimen is incident on each ellipsoidal reflecting mirror, each ellipsoidal reflecting mirror focuses the cathode fluorescence 5 incident on the corresponding ellipsoidal reflecting mirror on the cathode fluorescence detector. Preferably, four identical ellipsoidal reflecting mirrors are connected successively to form the ring-shaped reflector 32 with a through hole in the middle.

As shown in FIG. 5 to FIG. 9, in some optional implementations:

the scanning electron microscope provided by the present disclosure may include from top to bottom: the electron optical column 1, the first detector 2, the second detector 3 and a specimen. The specimen is placed on a specimen stage 4. The electron optical column 1 may include: the electron source 11, the electron accelerating structure 12 and the object lens system 14. The object lens system 14 focuses the electron beams on the specimen and scans it.

The first detector 2 is arranged to receive the electrons generated by the electron beams acting on the specimen. The second detector 3 is arranged to receive the photons generated by the electron beams acting on the specimen. The reflector 32 is in a ring shape and is arranged to cover the perimeter of the specimen. The reflector 32 reflects the photons generated on the specimen on the photon detector 31.

In some optional implementations, the first detector 2 is in a ring shape, the photon detector 31 is in a ring shape, and the reflector 32 is in a ring shape. The first detector 2, the reflector 32 and the photon detector 31 are on the same axis, and the axis is the center of the principal optic axis 6 of the electron beams generated by the electron source 11.

The reflector 2 may include the light outlet 322 and the port 321 which are connected. The light outlet 322 faces towards the first detector 2. The photon detector 31 is provided between the reflector 32 and the electron optical column 1. The photon detector 31 may be provided above the first detector 2 or below the first detector 2. The first detector 2 may be arranged at the center hole of the photon detector 31, the first detector 2 is arranged in the inner ring, and the photon detector 31 is arranged in the outer ring.

The present embodiment is illustrated taking that the photon detector 31 is provided below the first detector 2. The reflector 32 is provided with a center hole, one end of the center hole is the light outlet 322 and the other end of the center hole is the port 321. The light outlet 322 is an outlet of the light reflected by the reflector 32, that is, the end of the reflected light outlet of the center hole.

Further, the diameter of the light outlet 322 is greater than the diameter of the center hole of the photon detector 31, and the diameter of the center hole of the photon detector 31 is greater than or equal to the peripheral diameter of the first detector 2.

An illustration is given taking that the first detector 2 is the backscattered electron detector, the second detector 3 is the cathode fluorescence detector, and the photon detector 31 is the cathode fluorescence detector as an example.

The velocity of the electron beams generated by the electron source 11 is increased after passing through the electron accelerating structure 12. The electron beams, which are accelerated by the electron accelerating structure 12, move downward after being focused and changed in the direction of motion by the object lens system 14, act on the specimen after passing through the center hole of the first detector 2, the center hole of the photon detector 31 and the center hole of the reflector 32 successively, and generate secondary electrons, backscattered electrons, Auger electrons, cathode fluorescence 5, X-ray, and etc.

The backscattered electrons generated by the electron beams acting on the specimen scatter upwards directly from the specimen. The backscattered electrons are received by the backscattered electron detector above after passing through the center hole of the reflector 32 and the center hole of the cathode fluorescence detector.

The cathode fluorescence 5 generated by the electron beams acting on the specimen scatters upwards directly from the specimen. After passing through the center hole of the reflector 32, a part of the cathode fluorescence 5 is directly incident on and received by the cathode fluorescence detector on the above.

A part of the cathode fluorescence 5 is incident on the ring-shaped reflector 32 provided above the perimeter of the specimen, the ring-shaped reflector 32 reflects the cathode fluorescence 5 scattering from the perimeter of the specimen on the cathode fluorescence detector, which realizes the large-area collection of the cathode fluorescence 5 and high reception efficiency of the cathode fluorescence detector.

Moreover, another part of the cathode fluorescence 5 is incident on the lower surface of the backscattered electron detector after passing through the center hole of the reflector 32 and the center hole of the cathode fluorescence detector successively. The lower surface of the backscattered electron detector is provided with the reflective film 21. The cathode fluorescence 5 incident on the lower surface of the backscattered electron detector is reflected on the cathode fluorescence detector by the reflective film 21. The reception efficiency of the cathode fluorescence detector for the cathode fluorescence 5 is improved. The scanning electron microscope provided by the present disclosure can collect the backscattered electron and the cathode fluorescence 5 in a large area simultaneously, and thus has a high reception efficiency.

Specifically, as shown in FIG. 9, the surface for reflecting the cathode fluorescence 5 of the reflector 32 is a reflecting surface 323. The reflecting surface 323 may be of a paraboloid, an ellipsoid, or any other shape that can reflect the cathode fluorescence 5 incident on the reflecting surface 323 onto the cathode fluorescence detector.

In a specific optional embodiment, as shown in FIG. 5, the reflector 32 is the parabolic reflecting mirror. The cathode fluorescence 5 is incident on the lower surface of the backscattered electron detector after passing through the center hole of the reflector 32 and the center hole of the cathode fluorescence detector successively. The lower surface of the backscattered electron detector is provided with the reflective film 21. The cathode fluorescence 5 incident on the lower surface of the backscattered electron detector is reflected on the parabolic reflecting mirror by the reflective film 21. After the cathode fluorescence is incident on the parabolic reflecting mirror, the point where the electron beams act on the specimen is the action point, which is in mirror symmetry with the focal point of the parabolic reflecting mirror about the reflective film 21. The parabolic reflecting mirror converts the cathode fluorescence 5 incident on it into the parallel cathode fluorescence 5 beams and reflects the beams on the cathode fluorescence detector.

In some optional embodiments, the reflector 32 is the parabolic reflecting mirror, the point where the electron beams act on the specimen is the action point, which coincides with the focal point of the parabolic reflecting mirror, the parabolic reflecting mirror is arranged to cover the perimeter of the specimen, the cathode fluorescence 5 is generated from the action point where the electron beams act on the specimen and scatter upwards from the specimen, and after the cathode fluorescence 5 is incident on the parabolic reflecting mirror, the parabolic reflecting mirror converts the cathode fluorescence 5 incident on it into the parallel cathode fluorescence beams and reflects the beams on the cathode fluorescence detector.

Figure 6:
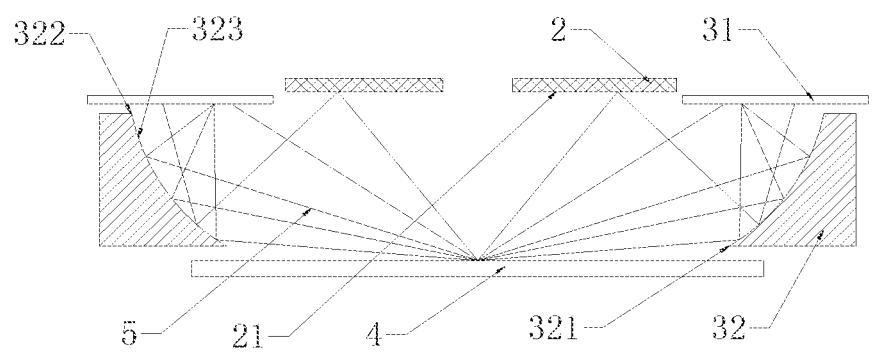
FIG. 6 illustrates a structural schematic diagram of another implementation of a second detector in FIG. 5 of the present disclosure.

In some optional embodiments, as shown in FIG. 6, the reflector 32 is the ellipsoidal reflecting mirror, the point where the electron beams act on the specimen is an action point, which coincides with the focal point of the ellipsoidal reflecting mirror, the ellipsoidal reflecting mirror is arranged to cover the perimeter of the specimen, the cathode fluorescence 5 is generated from the action point where the electron beams act on the specimen and scatter upwards from the specimen, and after the cathode fluorescence 5 is incident on the ellipsoidal reflecting mirror, the ellipsoidal reflecting mirror focuses the cathode fluorescence 5 incident on it on the cathode fluorescence detector.

Figure 7:
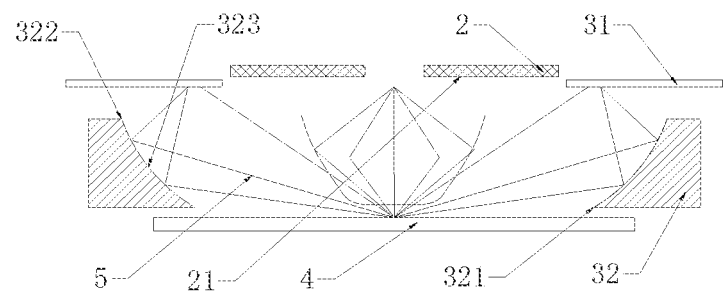
FIG. 7 illustrates a structural schematic diagram of yet another implementation of a second detector in FIG. 5 of the present disclosure.
Figure 8:
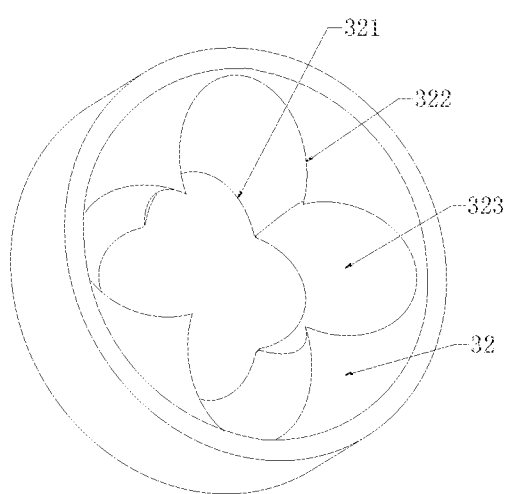
FIG. 8 illustrates a structural schematic diagram of a reflector in FIG. 7 of the present disclosure.

In some optional implementations, as shown in FIG. 7 and FIG. 8, the reflector 32 is in a ring shape formed by at least two ellipsoidal reflecting mirrors connected to each other. A plurality of ellipsoidal reflecting mirrors are connected successively to form the ring-shaped reflector 32 with a through hole in the middle. The ring-shaped reflector 32 is arranged to cover the perimeter of the specimen. After the cathode fluorescence 5 generated by the electron beams acting on the specimen is incident on each ellipsoidal reflecting mirror, each ellipsoidal reflecting mirror focuses the cathode fluorescence 5 incident on the corresponding ellipsoidal reflecting mirror on the cathode fluorescence detector. Preferably, four identical ellipsoidal reflecting mirrors are connected successively to form the ring-shaped reflector 32 with a through hole in the middle.

The above are only the preferred embodiments of the present disclosure and not intended to limit the form of the present disclosure. Although the present disclosure has been disclosed above through the preferred embodiments, the preferred embodiments are not intended to limit the present disclosure. Any skilled familiar with the patent may utilize the above disclosed technical content to make a few changes or modifications which are equivalent embodiments of the same change without departing from the scope of the technical solutions of the present disclosure. As long as not departing from the content of the technical solutions of the present disclosure, any simple alternation, equivalent change and modification made to the above embodiments according to the technical essence of the present disclosure shall fall within the scope of the technical solutions of the present disclosure.

The invention claimed is:

1. A scanning electron microscope, comprising:
an electron optical column, arranged to generate electron beams and focus the electron beams on a specimen;
a first detector, arranged to receive electrons generated by the electron beams acting on the specimen; and
a second detector, arranged to receive photons generated by the electron beams acting on the specimen;
wherein the second detector comprises a reflector and a photon detector; the reflector is in a ring shape and is arranged to cover a perimeter of the specimen; and the reflector is arranged to reflect the photons generated on the specimen onto the photon detector;
wherein a reflective film is provided at a lower surface of the first detector and is arranged to reflect the photons incident on the lower surface of the first detector to the second detector.

2. The scanning electron microscope of claim 1, wherein the reflector is a parabolic reflecting mirror or an ellipsoidal reflecting mirror.

3. A scanning electron microscope, comprising:
an electron optical column, arranged to generate electron beams and focus the electron beams on a specimen;
a first detector, arranged to receive electrons generated by the electron beams acting on the specimen; and
a second detector, arranged to receive photons generated by the electron beams acting on the specimen;
wherein the second detector comprises a reflector and a photon detector; the reflector is in a ring shape and is arranged to cover a perimeter of the specimen; and the reflector is arranged to reflect the photons generated on the specimen onto the photon detector; and
wherein the reflector is in the ring shape formed by at least two ellipsoidal reflecting mirrors connected to each other.

4. The scanning electron microscope of claim 1, wherein the first detector is a backscattered electron detector, and the second detector is a cathode fluorescence detector.

5. A scanning electron microscope, comprising:
an electron optical column, arranged to generate electron beams and focus the electron beams on a specimen;
a first detector, arranged to receive electrons generated by the electron beams acting on the specimen; and
a second detector, arranged to receive photons generated by the electron beams acting on the specimen;
wherein the second detector comprises a reflector and a photon detector; the reflector is in a ring shape and is arranged to cover a perimeter of the specimen; and the reflector is arranged to reflect the photons generated on the specimen onto the photon detector; and
wherein the photon detector is in a ring shape, and the first detector is in a ring shape; and
the first detector, the reflector and the photon detector are on a same axis, and the axis is a center of a principal optic axis of the electron beams generated by an electron source.

6. The scanning electron microscope of claim 5, wherein the reflector comprises a light outlet and a port which are connected, and the light outlet faces towards the specimen.

7. The scanning electron microscope of claim 6, wherein a diameter of the port is greater than or equal to a peripheral diameter of the first detector; and
a diameter of the light outlet is greater than a diameter of a center hole of the photon detector.

8. The scanning electron microscope of claim 5, wherein the reflector comprises a light outlet and a port which are connected, and the light outlet faces towards the first detector.

9. The scanning electron microscope of claim 6, wherein a diameter of the light outlet is greater than a diameter of a center hole of the photon detector; and a diameter of a center hole of the photon detector is greater than or equal to a peripheral diameter of the first detector.

* * * * *